United States Patent
Lee et al.

(10) Patent No.: US 10,964,251 B2
(45) Date of Patent: Mar. 30, 2021

(54) PIXEL ARRAY SUBSTRATE AND DRIVING METHOD THEREOF

(71) Applicant: Au Optronics Corporation, Hsinchu (TW)

(72) Inventors: Min-Tse Lee, Hsinchu (TW); Yueh-Hung Chung, Taipei (TW); Ya-Ling Hsu, New Taipei (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/515,033

(22) Filed: Jul. 18, 2019

(65) Prior Publication Data

US 2020/0219434 A1 Jul. 9, 2020

(30) Foreign Application Priority Data

Jan. 3, 2019 (TW) ................................ 108100260

(51) Int. Cl.
*G09G 3/22* (2006.01)
*H01L 27/12* (2006.01)

(52) U.S. Cl.
CPC ............. *G09G 3/22* (2013.01); *H01L 27/124* (2013.01)

(58) Field of Classification Search
CPC ......... G02F 1/136286; G02F 1/136213; G02F 1/1368; G09G 3/22; G09G 3/36
See application file for complete search history.

(56) References Cited

U.S. PATENT DOCUMENTS

| | | | |
|---|---|---|---|
| 9,551,912 B2* | 1/2017 | Xu | ........................ H01L 27/1255 |
| 2013/0271436 A1* | 10/2013 | Shiomi | ..................... G09G 3/36 345/204 |
| 2016/0351151 A1* | 12/2016 | Cao | .................... G02F 1/136286 |
| 2017/0039966 A1* | 2/2017 | Xu | ........................ G09G 3/2003 |
| 2017/0229087 A1* | 8/2017 | Xu | ........................ G09G 3/3655 |
| 2018/0114478 A1 | 4/2018 | Tien et al. | |

FOREIGN PATENT DOCUMENTS

| TW | I433099 | 4/2014 |
|---|---|---|
| TW | I598864 | 9/2017 |

* cited by examiner

*Primary Examiner* — Sardis F Azongha
(74) *Attorney, Agent, or Firm* — JCIPRNET

(57) ABSTRACT

A pixel array substrate includes pixel structures. Each pixel structure includes a first pixel electrode, a second pixel electrode, a first data line, a second data line, and a scan line. The first pixel electrode and the second pixel electrode are sequentially arranged in a first direction and respectively have a first side and a second side opposite to each other. The pixel structures include first and second pixel structures. A first data line of each first pixel structure is located at the first side, and a second data line of each first pixel structure is located at the second side. A first data line of each second pixel structure is located at the second side; a second data line of each second pixel structure is located at the first side. The first and second pixel structures are sequentially arranged in the first direction to form a first pixel series.

10 Claims, 4 Drawing Sheets

PIXEL ARRAY SUBSTRATE AND DRIVING METHOD THEREOF

CROSS-REFERENCE TO RELATED APPLICATION

This application claims the priority benefit of Taiwan application serial no. 108100260, filed on Jan. 3, 2019. The entirety of the above-mentioned patent application is hereby incorporated by reference herein and made a part of this specification.

BACKGROUND

Technical Field

The disclosure relates to a pixel array substrate and a driving method thereof.

Description of Related Art

With the development of display technologies, displays have been commonly applied in a variety of electronic products. In the case of a public display, in general, the public display is required to have high brightness for public viewing. One way to ensure the high brightness of the public display is to increase the brightness of the backlight module of the public display. However, when the brightness of the backlight module is increased, the amount of light receiving by thin film transistors (TFT) in the display panel of the public display is also increased, which may lead to power leakage and further, a V-crosstalk issue. To solve the V-crosstalk issue, it used to change the polarity of the driver pixels through 2 line dot inversion rather than column inversion; however, large vertical diamond check patterns may be generated, e.g., a swing line issue may occur.

SUMMARY

The disclosure provides a pixel array substrate and a driving method thereof, whereby the swing line issue can be resolved to some extent.

In an embodiment of the disclosure, a pixel array substrate includes a plurality of pixel structures. Each of the pixel structures includes a first active device, a second active device, a first pixel electrode, a second pixel electrode, a first data line, a second data line, and a scan line. The first pixel electrode and the second pixel electrode are sequentially arranged in a first direction and electrically connected to the first active device and the second active device, respectively. The first pixel electrode and the second pixel electrode have a first side and a second side opposite to each other. The first data line and the second data line are electrically connected to the first active device and the second active device, respectively. The scan line is electrically connected to the first active device and the second active device. The pixel array structures include a plurality of first pixel structures and a plurality of second pixel structures. A first data line of each of the first pixel structures is located at the first side, and a second data line of each of the first pixel structures is located at the second side. A first data line of each of the second pixel structures is located at the second side, and a second data line of each of the second pixel structures is located at the first side. The first pixel structures and the second pixel structures are sequentially arranged in the first direction to form a first pixel series.

According to an embodiment of the disclosure, the pixel array substrate further includes a second pixel series. The second pixel structures and the first pixel structures are sequentially arranged in the first direction to form a second pixel series. The first pixel series and the second pixel series are sequentially arranged in a second direction, and the first direction and the second direction are staggered.

In an embodiment of the disclosure, a driving method for driving the aforesaid pixel array substrate includes following steps: at a first timing, the first active device and the second active device of one of the first pixel structures of the first pixel series are switched on, the first data line of the one of the first pixel structures of the first pixel series has a first polarity, and the second data line of the one of the first pixel structures of the first pixel series has a second polarity opposite to the first polarity; at the first timing, the first active device and the second active device of one of the second pixel structures of the second pixel series are switched on, the first data line of the one of the second pixel structures of the second pixel series has the second polarity, and the second data line of the one of the second pixel structures of the second pixel series has the first polarity; at a second timing, the first active device and the second active device of another of the first pixel structures of the first pixel series are switched on, the first data line of the another of the first pixel structures of the first pixel series has the second polarity, and the second data line of the another of the first pixel structures of the first pixel series has the first polarity; at the second timing, the first active device and the second active device of another of the second pixel structures of the second pixel series are switched on, the first data line of the another of the second pixel structures of the second pixel series has the first polarity, and the second data line of the another of the second pixel structures of the second pixel series has the second polarity, wherein the first timing and the second timing sequentially occur.

To make the above features and advantages provided in one or more of the embodiments of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DESCRIPTION OF THE EMBODIMENTS

Figure 1:
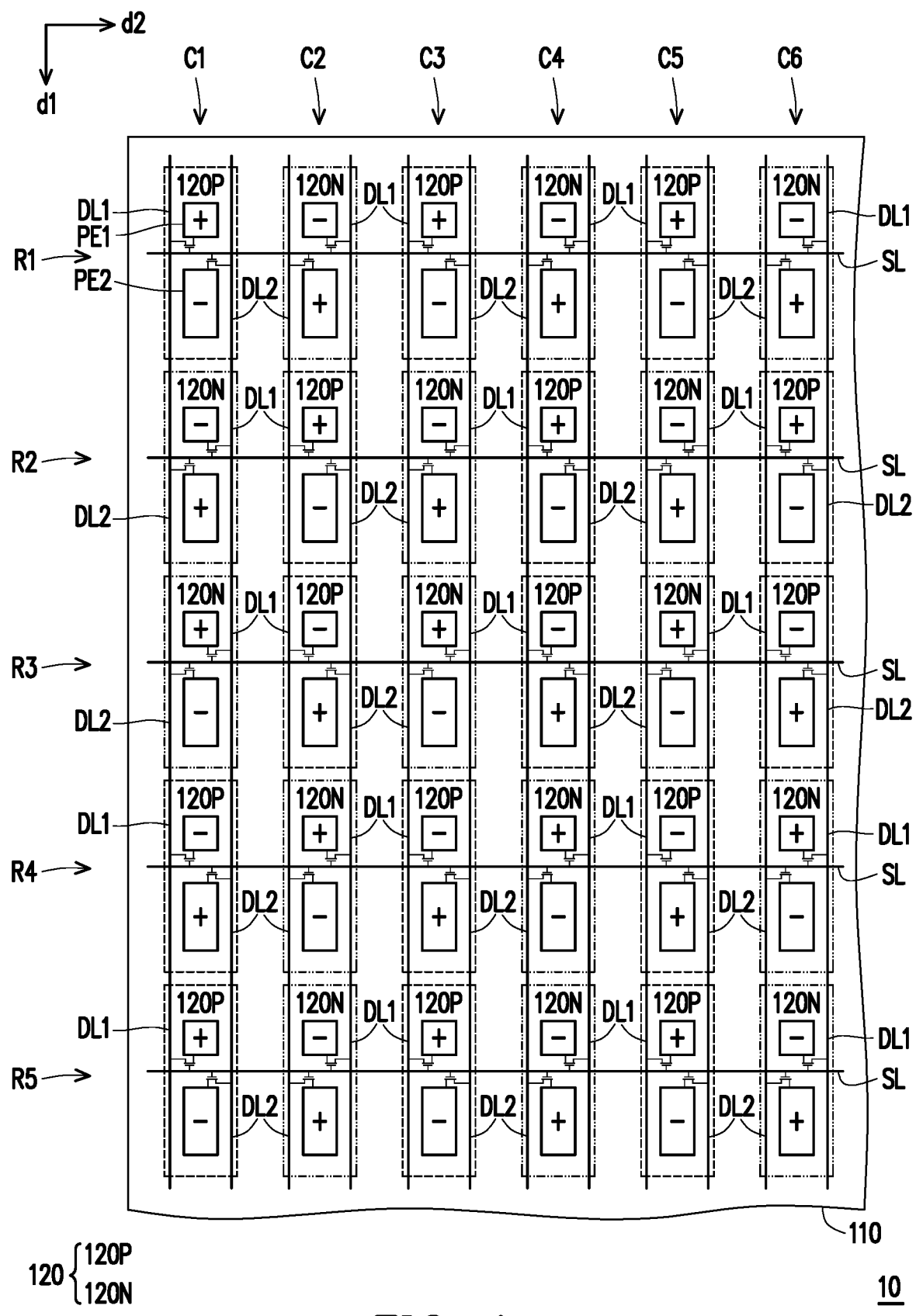
FIG. 1 is a schematic view of a pixel array substrate according to an embodiment of the disclosure.

In the accompanying drawings, thicknesses of layers, films, panels, regions and so on are exaggerated for clarity. Throughout the specification, the same reference numerals in the accompanying drawings denote the same elements. It should be understood that when an element such as a layer, film, region or substrate is referred to as being "on" or "connected to" another element, it can be directly on or connected to the other element, or intervening elements may also be present. In contrast, when an element is referred to as being "directly on" or "directly connected to" another element, there are no intervening elements present. As used herein, the term "connected" may refer to physically connected and/or electrically connected. Besides, the term "electrically connected to" or "coupled", there may exist other intervening elements between two elements.

The term "about," "approximately," "essentially," or "substantially" as used herein is inclusive of the stated value and means within an acceptable range of deviation for the particular value as determined by persons of ordinary skill in the art, considering the measurement in question and the error associated with measurement of the particular quantity (i.e., the limitations of the measurement system). For example, "about" may mean within one or more standard deviations, or within, for example, ±30%, ±20%, ±10%, ±5% of the stated value. Moreover, a relatively acceptable range of deviation or standard deviation may be chosen for the term "about," "approximately," or "substantially" as used herein based on optical properties, etching properties or other properties, instead of applying one standard deviation across all the properties.

Unless otherwise defined, all terms (including technical and scientific terms) used herein have the same meaning as commonly understood by persons of ordinary skill in the art. It will be further understood that terms, such as those defined in commonly used dictionaries, should be interpreted as having a meaning that is consistent with their meaning in the context of the relevant art and the disclosure and will not be interpreted in an idealized or overly formal sense unless expressly so defined herein.

The exemplary embodiments are described below with reference to a cross-sectional view of a schematic diagram of idealized embodiments. Therefore, a shape change of the figure serving as a result of manufacturing techniques and/or tolerances may be expected. As a result, the embodiments provided herein should not be construed as limited to a particular shape of a region as shown herein but includes a shape deviation caused by manufacturing tolerance. For instance, a shown or described flat area may generally have rough and/or non-linear features. Besides, acute angles shown in the drawings may be round. Accordingly, a region shown in the figure is essentially schematic, and a shape thereof is not intended to show an accurate shape of the region, and is not intended to limit a range of the claims provided herein.

The exemplary embodiments provided herein are elaborated with reference to the accompanying drawings. Wherever possible, the same reference numbers are used in the drawings and the description to refer to the same or like parts.

Figure 3:
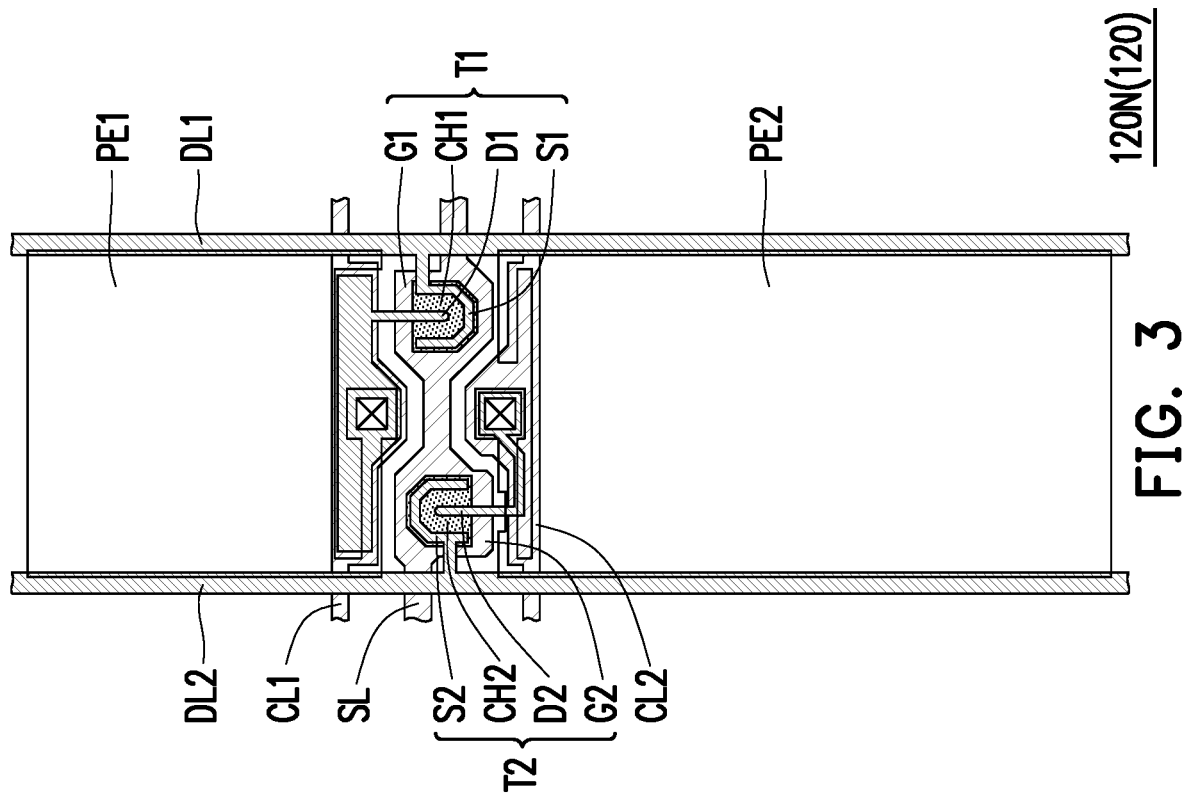
FIG. 3 is a schematic view of a layout of a first pixel structure according to an embodiment of the disclosure.
Figure 2:
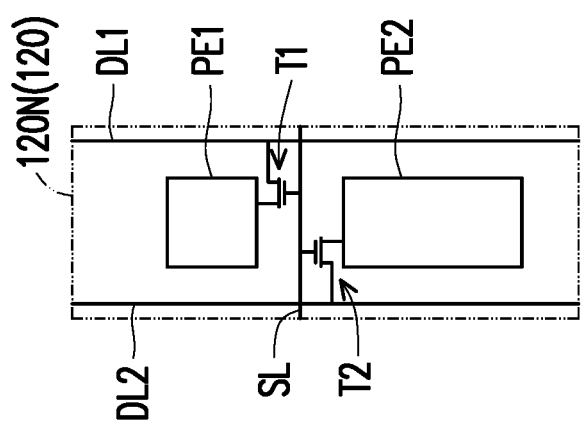
FIG. 2 is a schematic view of a first pixel structure according to an embodiment of the disclosure.
Figure 5:
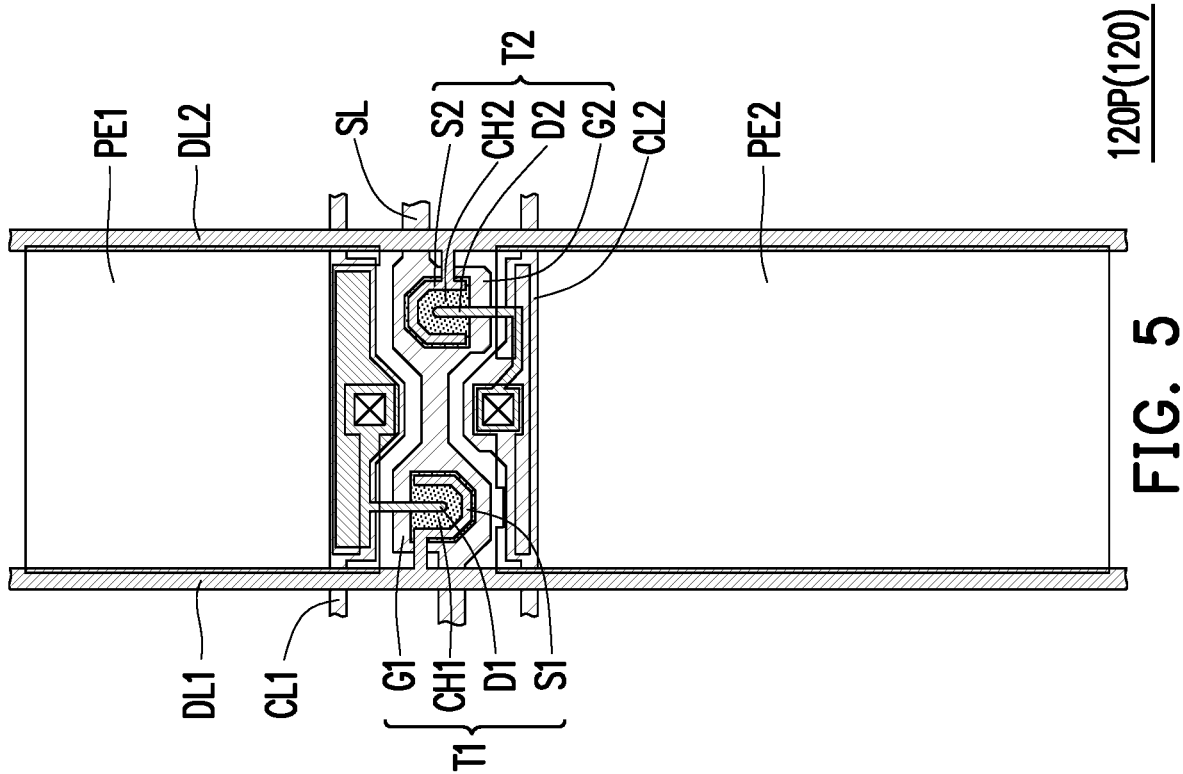
FIG. 5 is a schematic view of a layout of a second pixel structure according to an embodiment of the disclosure.
Figure 4:
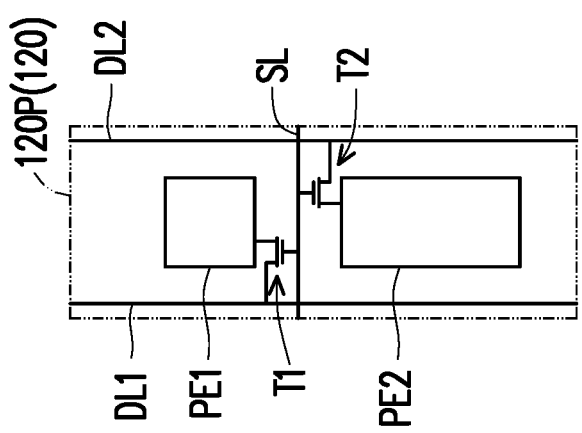
FIG. 4 is a schematic enlarged view of a second pixel structure according to an embodiment of the disclosure.

FIG. 1 is a schematic view of a pixel array substrate according to an embodiment of the disclosure. FIG. 2 is a schematic view of a first pixel structure according to an embodiment of the disclosure. FIG. 3 is a schematic view of a layout of a first pixel structure according to an embodiment of the disclosure. FIG. 4 is a schematic enlarged view of a second pixel structure according to an embodiment of the disclosure. FIG. 5 is a schematic view of a layout of a second pixel structure according to an embodiment of the disclosure. Note that a first common line CL1 and a second common line CL2 depicted in FIG. 3 and FIG. 5 are omitted in FIG. 1, FIG. 2, and FIG. 4.

With reference to FIG. 1, a pixel array substrate 10 includes a substrate 110 and a plurality of pixel structures 120 disposed on the substrate 110. In the present embodiment, the substrate 110 is, for instance, a transparent substrate and can be made of glass, quartz, organic polymer, or any other appropriate material. However, the disclosure is not limited thereto; in other embodiments, the substrate 110 may be an opaque/reflective substrate and may be made of a conductive material, a wafer, ceramics, or any other appropriate material. It should be mentioned that 6×5 pixel structures 120 are depicted in FIG. 1; however, people having ordinary skill in the art should be able to obtain the desired pixel array substrate according to FIG. 1 to FIG. 5 as well as the following descriptions.

With reference to FIG. 2 to FIG. 5, each pixel structure 120 includes a first data line DL1, a second data line DL2, a scan line SL, a first active device T1, a second active device T2, a first pixel electrode PE1, and a second pixel electrode PE2.

The first data line DL1 and the second data line DL2 are staggered with the scan line SL. In the present embodiment, the first data line DL1 and the second data line DL2 are extended in a first direction d1, the scan line SL is extended in a second direction d2, and the first direction d1 and the second direction d2 are staggered. For instance, the first direction d1 and the second direction d2 can be selectively perpendicular to each other, which should however not be construed as a limitation in the disclosure.

The first data line DL1 and the second data line DL2 are electrically connected to the first active device T1 and the second active device T2, respectively. The scan line SL is electrically connected to the first active device T1 and the second active device T2. The first pixel electrode PE1 and the second pixel electrode PE2 are electrically connected to the first active device T1 and the second active device T2, respectively. That is, the first active device T1 and the second active device T2 share one scan line SL and respectively drive the first active device T1 and the second active device T2 with use of two different data lines (i.e., the first data line DL1 and the second data line DL2). In brief, the pixel structures 120 are driven through 2D1G.

In the present embodiment, the first active device T1 includes a first thin film transistor (TFT) having a gate G1, a semiconductor pattern CH1, and a source S1 and a drain D1 electrically connected to two different regions of the semiconductor pattern CH1, respectively. The source S1 of the first active device T1 is electrically connected to the first data line DL1, the gate G1 of the first active device T1 is electrically connected to the scan line SL, and the drain D1 of the first active device T1 is electrically connected to the first pixel electrode PE1; the second active device T2 includes a second TFT having a gate G2, a semiconductor pattern CH2, and a source S2 and a drain D2 electrically connected to two different regions of the semiconductor pattern CH2, respectively. The source S2 of the second active device T2 is electrically connected to the second data line DL2, the gate G2 of the second active device T2 is electrically connected to the scan line SL, and the drain D2 of the second active device T2 is electrically connected to the second pixel electrode PE2.

Besides, in the present embodiment, the pixel structure 120 can also include a first common line CL1 and a second common line CL2, wherein the first common line CL1 can be overlapped with a portion of the first pixel electrode PE1 to form a first storage capacitor; the second common line CL2 can be overlapped with a portion of the second pixel electrode PE2 to generate a second storage capacitor. For instance, according to the present embodiment, an area of the first pixel electrode PE1 can be selectively smaller than an area of the second pixel electrode PE2, and a first storage capacitance is less than a second storage capacitance. When a display panel having the pixel structures 120 is being driven (i.e., when the scan line SL has a potential at which the gate is on), the first storage capacitor is fully charged first, and the region where the first pixel electrode PE1 is located is lighted up. That is, in the present embodiment, the first data line DL1, the scan line SL, the first active device T1, the first pixel electrode PE1, and the first storage capacitor can constitute a main sub-pixel structure, and the second data line DL2, the scan line SL, the second active device T2, the second pixel electrode PE2, and the second storage capacitor can constitute a secondary sub-pixel structure, which should however not be construed as a limitation in the disclosure.

With reference to FIG. 1, the pixel structures 120 of the pixel array substrate 10 include a plurality of first pixel structures 120N and a plurality of second pixel structures 120P. The layout of the first pixel structures 120N is slightly different from the layout of the second pixel structures 120P. Specifically, at least some of the differences therebetween are described below. The first pixel electrode PE1 and the second pixel electrode PE2 of each pixel structure 120 are sequentially arranged in a first direction d1, and the first pixel electrode PE1 and the second pixel electrode PE2 respectively have a first side (including but not limited to: a right-hand side) and a second side (including but not limited to: a left-hand side) opposite to each other; the first data line DL1 of the first pixel structure 120N is located at the first side, and the second data line DL2 of the first pixel structure 120N is located at the second side; the first data line DL1 of the second pixel structure 120P is located at the second side, and the second data line DL2 of the second pixel structure 120P is located at the first side. That is, in the present embodiment, the data line (i.e., the first data line DL1) of the main sub-pixel structure of the first pixel structure 120N is located at the right-hand side, and the data line of the secondary sub-pixel structure of the first pixel structure 120N (i.e., the second data line DL2) is located at the left-hand side; the data line of the main sub-pixel structure of the second pixel structure 120P (i.e., the first data line DL1) is located at the left-hand side, and the data line of the secondary sub-pixel structure of the second pixel structure 120P (i.e., the second data line DL2) is located at the right-hand side.

With reference to FIG. 1, the pixel structures 120 are arranged to form a plurality of pixel series C1-C6 and a plurality of pixel groups R1-R5; namely, the pixel structures 120 are arranged to form a plurality of pixel columns and a plurality of pixel rows. In the present embodiment, the pixel series C1-C6 include a first pixel series C1, a second pixel series C2, third pixel series C3, fourth pixel series C4, fifth pixel series C5 and sixth pixel series C6 that are sequentially arranged in the second direction d2, and the pixel groups R1-R5 include a first pixel group R1, a second pixel group R2, a third pixel group R3, a fourth pixel group R4, and a fifth pixel group R5 that are sequentially arranged in the first direction d1.

For instance, in the present embodiment, the first pixel series C1 includes the second pixel structure 120P, the first pixel structure 120N, the first pixel structure 120N, the second pixel structure 120P, and the second pixel structure 120P that are sequentially arranged in the first direction d1; the second pixel series C2 includes the first pixel structure 120N, the second pixel structure 120P, the second pixel structure 120P, the first pixel structure 120N, and the first pixel structure 120N that are sequentially arranged in the first direction d1; the third pixel series C3 includes the second pixel structure 120P, the first pixel structure 120N, the first pixel structure 120N, the second pixel structure 120P, and the second pixel structure 120P that are sequentially arranged in the first direction d1; the fourth pixel series C4 includes the first pixel structure 120N, the second pixel structure 120P, the second pixel structure 120P, the first pixel structure 120N, and the first pixel structure 120N that are sequentially arranged in the first direction d1; the fifth pixel series C5 includes the second pixel structure 120P, the first pixel structure 120N, the first pixel structure 120N, the second pixel structure 120P, and the second pixel structure 120P that are sequentially arranged in the first direction d1; the sixth pixel series C6 includes the first pixel structure 120N, the second pixel structure 120P, the second pixel structure 120P, the first pixel structure 120N, and the first pixel structure 120N that are sequentially arranged in the first direction d1.

In the first pixel series C1, it should be mentioned that the second data line DL2 of the second pixel structure 120P, the first data line DL1 of the first pixel structure 120N, the first data line DL1 of the first pixel structure 120N, the second data line DL2 of the second pixel structure 120P, and the second data line DL2 of the second pixel structure 120P are sequentially arranged and electrically connected; that is, as a matter of fact, at the first side (including but not limited to: the right-hand side), the second data line DL2 of the second pixel structure 120P, the first data line DL1 of the first pixel structure 120N, the first data line DL1 of the first pixel structure 120N, the second data line DL2 of the second pixel structure 120P, and the second data line DL2 of the second pixel structure 120P of the first pixel series C1 are the same conductive wire. Similarly, in the first pixel series C1, the first data line DL1 of the second pixel structure 120P, the second data line DL2 of the first pixel structure 120N, the second data line DL2 of the first pixel structure 120N, the first data line DL1 of the second pixel structure 120P, and the first data line DL1 of the second pixel structure 120P are sequentially arranged and electrically connected; that is, as a matter of fact, at the first side (including but not limited to: the left-hand side), the first data line DL1 of the second pixel structure 120P, the second data line DL2 of the first pixel structure 120N, the second data line DL2 of the first pixel structure 120N, the first data line DL1 of the second pixel structure 120P, and the first data line DL1 of the second pixel structure 120P of the first pixel series C1 are the same conductive wire.

In the second pixel series C2, the first data line DL1 of the first pixel structure 120N, the second data line DL2 of the second pixel structure 120P, the second data line DL2 of the second pixel structure 120P, the first data line DL1 of the first pixel structure 120N, and the first data line DL1 of the first pixel structure 120N are sequentially arranged and electrically connected; that is, as a matter of fact, at the first side (including but not limited to: the right-hand side), the first data line DL1 of the first pixel structure 120N, the second data line DL2 of the second pixel structure 120P, the second data line DL2 of the second pixel structure 120P, the first data line DL1 of the first pixel structure 120N, and the first data line DL1 of the first pixel structure 120N of the second pixel series C2 are the same conductive wire. Similarly, in the second pixel series C2, the second data line DL2 of the first pixel structure 120N, the first data line DL1 of the second pixel structure 120P, the first data line DL1 of the second pixel structure 120P, the second data line DL2 of the first pixel structure 120N, and the second data line DL2 of the first pixel structure 120N are sequentially arranged and electrically connected; that is, as a matter of fact, at the second side (including but not limited to: the left-hand side), the second data line DL2 of the first pixel structure 120N, the first data line DL1 of the second pixel structure 120P, the first data line DL1 of the second pixel structure 120P, the second data line DL2 of the first pixel structure 120N, and the second data line DL2 of the first pixel structure 120N of the second pixel series C2 are the same conductive wire.

In the third pixel series C3, the second data line DL2 of the second pixel structure 120P, the first data line DL1 of the first pixel structure 120N, the first data line DL1 of the first pixel structure 120N, the second data line DL2 of the second pixel structure 120P, and the second data line DL2 of the second pixel structure 120P are sequentially arranged and electrically connected; that is, as a matter of fact, at the first side (including but not limited to: the right-hand side), the second data line DL2 of the second pixel structure 120P, the first data line DL1 of the first pixel structure 120N, the first data line DL1 of the first pixel structure 120N, the second data line DL2 of the second pixel structure 120P, and the second data line DL2 of the second pixel structure 120P of the third pixel series C3 are the same conductive wire. Similarly, in the third pixel series C3, the first data line DL1 of the second pixel structure 120P, the second data line DL2 of the first pixel structure 120N, the second data line DL2 of the first pixel structure 120N, the first data line DL1 of the second pixel structure 120P, and the first data line DL1 of the second pixel structure 120P are sequentially arranged and electrically connected; that is, as a matter of fact, at the first side (including but not limited to: the left-hand side), the first data line DL1 of the second pixel structure 120P, the second data line DL2 of the first pixel structure 120N, the second data line DL2 of the first pixel structure 120N, the first data line DL1 of the second pixel structure 120P, and the first data line DL1 of the second pixel structure 120P of the third pixel series C3 are the same conductive wire.

In the fourth pixel series C4, the first data line DL1 of the first pixel structure 120N, the second data line DL2 of the second pixel structure 120P, the second data line DL2 of the second pixel structure 120P, the first data line DL1 of the first pixel structure 120N, and the first data line DL1 of the first pixel structure 120N are sequentially arranged and electrically connected; that is, as a matter of fact, at the first side (including but not limited to: the right-hand side), the first data line DL1 of the first pixel structure 120N, the second data line DL2 of the second pixel structure 120P, the second data line DL2 of the second pixel structure 120P, the first data line DL1 of the first pixel structure 120N, and the first data line DL1 of the first pixel structure 120N of the fourth pixel series C4 are the same conductive wire. Similarly, in the fourth pixel series C4, the second data line DL2 of the first pixel structure 120N, the first data line DL1 of the second pixel structure 120P, the first data line DL1 of the second pixel structure 120P, the second data line DL2 of the first pixel structure 120N, and the second data line DL2 of the first pixel structure 120N are sequentially arranged and electrically connected; that is, as a matter of fact, at the second side (including but not limited to: the left-hand side), the second data line DL2 of the first pixel structure 120N, the first data line DL1 of the second pixel structure 120P, the first data line DL1 of the second pixel structure 120P, the second data line DL2 of the first pixel structure 120N, and the second data line DL2 of the first pixel structure 120N of the fourth pixel series C4 are the same conductive wire.

In the fifth pixel series C5, the second data line DL2 of the second pixel structure 120P, the first data line DL1 of the first pixel structure 120N, the first data line DL1 of the first pixel structure 120N, the second data line DL2 of the second pixel structure 120P, and the second data line DL2 of the second pixel structure 120P are sequentially arranged and electrically connected; that is, as a matter of fact, at the first side (including but not limited to: the right-hand side), the second data line DL2 of the second pixel structure 120P, the first data line DL1 of the first pixel structure 120N, the first data line DL1 of the first pixel structure 120N, the second data line DL2 of the second pixel structure 120P, and the second data line DL2 of the second pixel structure 120P of the fifth pixel series C5 are the same conductive wire. Similarly, in the fifth pixel series C5, the first data line DL1 of the second pixel structure 120P, the second data line DL2 of the first pixel structure 120N, the second data line DL2 of the first pixel structure 120N, the first data line DL1 of the second pixel structure 120P, and the first data line DL1 of the second pixel structure 120P are sequentially arranged and electrically connected; that is, as a matter of fact, at the first side (including but not limited to: the left-hand side), the first data line DL1 of the second pixel structure 120P, the second data line DL2 of the first pixel structure 120N, the second data line DL2 of the first pixel structure 120N, the first data line DL1 of the second pixel structure 120P, and the first data line DL1 of the second pixel structure 120P of the fifth pixel series C5 are the same conductive wire.

In the sixth pixel series C6, the first data line DL1 of the first pixel structure 120N, the second data line DL2 of the second pixel structure 120P, the second data line DL2 of the second pixel structure 120P, the first data line DL1 of the first pixel structure 120N, and the first data line DL1 of the first pixel structure 120N are sequentially arranged and electrically connected; that is, as a matter of fact, at the first side (including but not limited to: the right-hand side), the first data line DL1 of the first pixel structure 120N, the second data line DL2 of the second pixel structure 120P, the second data line DL2 of the second pixel structure 120P, the first data line DL1 of the first pixel structure 120N, and the first data line DL1 of the first pixel structure 120N of the sixth pixel series C6 are the same conductive wire. Similarly, in the sixth pixel series C6, the second data line DL2 of the first pixel structure 120N, the first data line DL1 of the second pixel structure 120P, the first data line DL1 of the second pixel structure 120P, the second data line DL2 of the first pixel structure 120N, and the second data line DL2 of the first pixel structure 120N are sequentially arranged and electrically connected; that is, as a matter of fact, at the second side (including but not limited to: the left-hand side), the second data line DL2 of the first pixel structure 120N, the first data line DL1 of the second pixel structure 120P, the first data line DL1 of the second pixel structure 120P, the second data line DL2 of the first pixel structure 120N, and the second data line DL2 of the first pixel structure 120N of the sixth pixel series C6 are the same conductive wire.

The first pixel group R1 includes one second pixel structure 120P of the first pixel series C1, one first pixel structure 120N of the second pixel series C2, one second pixel structure 120P of the third pixel series C3, one first pixel structure 120N of the fourth pixel series C4, one second pixel structure 120P of the fifth pixel series C5, and one first pixel structure 120N of the sixth pixel series C6 that are sequentially arranged in the second direction d2. In the first pixel group R1, the scan line SL of one second pixel structure 120P, the scan line SL of one first pixel structure 120N, the scan line SL of one second pixel structure 120P, the scan line SL of one first pixel structure 120N, the scan line SL of one second pixel structure 120P, and the scan line SL of one first pixel structure 120N are sequentially arranged and electrically connected. That is, the scan lines SL of the first pixel structures 120N and the second pixel structures 120P of the first pixel group R1 are, as a matter of fact, the same conductive wire.

The second pixel group R2 includes one first pixel structure 120N of the first pixel series C1, one second pixel structure 120P of the second pixel series C2, one first pixel structure 120N of the third pixel series C3, one second pixel structure 120P of the fourth pixel series C4, one first pixel structure 120N of the fifth pixel series C5, and one second pixel structure 120P of the sixth pixel series C6 that are sequentially arranged in the second direction d2. In the second pixel group R2, the scan line SL of one first pixel structure 120N, the scan line SL of one second pixel structure 120P, the scan line SL of one first pixel structure 120N, the scan line SL of one second pixel structure 120P, the scan line SL of one first pixel structure 120N, and the scan line SL of one second pixel structure 120P are sequentially arranged and electrically connected. That is, the scan lines SL of the first pixel structures 120N and the second pixel structures 120P of the second pixel group R2 are, as a matter of fact, the same conductive wire.

The third pixel group R3 includes one first pixel structure 120N of the first pixel series C1, one second pixel structure 120P of the second pixel series C2, one first pixel structure 120N of the third pixel series C3, one second pixel structure 120P of the fourth pixel series C4, one first pixel structure 120N of the fifth pixel series C5, and one second pixel structure 120P of the sixth pixel series C6 that are sequentially arranged in the second direction d2. In the third pixel group R3, the scan line SL of one first pixel structure 120N, the scan line SL of one second pixel structure 120P, the scan line SL of one first pixel structure 120N, the scan line SL of one second pixel structure 120P, the scan line SL of one first pixel structure 120N, and the scan line SL of one second pixel structure 120P are sequentially arranged and electrically connected. That is, the scan lines SL of the first pixel structures 120N and the second pixel structures 120P of the third pixel group R3 are, as a matter of fact, the same conductive wire.

The fourth pixel group R4 includes one second pixel structure 120P of the first pixel series C1, one first pixel structure 120N of the second pixel series C2, one second pixel structure 120P of the third pixel series C3, one first pixel structure 120N of the fourth pixel series C4, one second pixel structure 120P of the fifth pixel series C5, and one first pixel structure 120N of the sixth pixel series C6 that are sequentially arranged in the second direction d2. In the fourth pixel group R4, the scan line SL of one second pixel structure 120P, the scan line SL of one first pixel structure 120N, the scan line SL of one second pixel structure 120P, the scan line SL of one first pixel structure 120N, the scan line SL of one second pixel structure 120P, and the scan line SL of one first pixel structure 120N are sequentially arranged and electrically connected. That is, the scan lines SL of the first pixel structures 120N and the second pixel structures 120P of the fourth pixel group R4 are, as a matter of fact, the same conductive wire.

The fifth pixel group R5 includes one second pixel structure 120P of the first pixel series C1, one first pixel structure 120N of the second pixel series C2, one second pixel structure 120P of the third pixel series C3, one first pixel structure 120N of the fourth pixel series C4, one second pixel structure 120P of the fifth pixel series C5, and one first pixel structure 120N of the sixth pixel series C6 that are sequentially arranged in the second direction d2. In the fifth pixel group R5, the scan line SL of one second pixel structure 120P, the scan line SL of one first pixel structure 120N, the scan line SL of one second pixel structure 120P, the scan line SL of one first pixel structure 120N, the scan line SL of one second pixel structure 120P, and the scan line SL of one first pixel structure 120N are sequentially arranged and electrically connected. That is, the scan lines SL of the first pixel structures 120N and the second pixel structures 120P of the fifth pixel group R5 are, as a matter of fact, the same conductive wire.

With reference to FIG. 1, the driving method of the pixel array structure 10 includes following steps.

At a first timing, the first active devices T1 and the second active devices T2 of the first pixel structures 120N and the second pixel structures 120P of the first pixel group R1 are switched on (i.e., the scan lines SL of the first pixel group R1 have the potential at which the gates are on), the first data lines DL1 and the first pixel electrodes PE1 of the second pixel structures 120P of the first pixel series C1 and the first pixel group R1 have the second polarity (e.g., the positive polarity), the second data lines DL2 and the second pixel electrodes PE2 of the second pixel structures 120P of the first pixel series C1 and the first pixel group R1 have the first polarity (e.g., the negative polarity), the first data lines DL1 and the first pixel electrodes PE1 of the first pixel structures 120N of the second pixel series C2 and the first pixel group R1 have the first polarity (e.g., the negative polarity), the second data lines DL2 and the second pixel electrodes PE2 of the first pixel structures 120N of the second pixel series C2 and the first pixel group R1 have the second polarity (e.g., the positive polarity), the first data lines DL1 and the first pixel electrodes PE1 of the second pixel structures 120P of the third pixel series C3 and the first pixel group R1 have the second polarity (e.g., the positive polarity), the second data lines DL2 and the second pixel electrodes PE2 of the second pixel structures 120P of the third pixel series C3 and the first pixel group R1 have the first polarity (e.g., the negative polarity), the first data lines DL1 and the first pixel electrodes PE1 of the first pixel structures 120N of the fourth pixel series C4 and the first pixel group R1 have the first polarity (e.g., the negative polarity), the second data lines DL2 and the second pixel electrodes PE2 of the first pixel structures 120N of the fourth pixel series C4 and the first pixel group R1 have the second polarity (e.g., the positive polarity), the first data lines DL1 and the first pixel electrodes PE1 of the second pixel structures 120P of the fifth pixel series C5 and the first pixel group R1 have the second polarity (e.g., the positive polarity), the second data lines DL2 and the second pixel electrodes PE2 of the second pixel structures 120P of the fifth pixel series C5 and the first pixel group R1 have the first polarity (e.g., the negative polarity), the first data lines DL1 and the first pixel electrodes PE1 of the first pixel structures 120N of the sixth pixel series C6 and the first pixel group R1 have the first polarity (e.g., the negative polarity), and the second data lines DL2 and the second pixel electrodes PE2 of the first pixel structures 120N of the sixth pixel series C6 and the first pixel group R1 have the second polarity (e.g., the positive polarity).

Next, at a second timing following the first timing, the first active devices T1 and the second active devices T2 of the first pixel structures 120N and the second pixel structures 120P of the second pixel group R2 are switched on (i.e., the scan lines SL of the second pixel group R2 have the potential at which the gates are on), the first data lines DL1 and the first pixel electrodes PE1 of the first pixel structures 120N of the first pixel series C1 and the second pixel group R2 have the first polarity (e.g., the negative polarity), the second data lines DL2 and the second pixel electrodes PE2 of the first pixel structures 120N of the first pixel series C1 and the second pixel group R2 have the second polarity (e.g., the positive polarity), the first data lines DL1 and the first pixel electrodes PE1 of the second pixel structures 120P of the second pixel series C2 and the second pixel group R2 have the second polarity (e.g., the positive polarity), the second data lines DL2 and the second pixel electrodes PE2 of the second pixel structures 120P of the second pixel series C2 and the second pixel group R2 have the first polarity (e.g., the negative polarity), the first data lines DL1 and the first pixel electrodes PE1 of the first pixel structures 120N of the third pixel series C3 and the second pixel group R2 have the first polarity (e.g., the negative polarity), the second data lines DL2 and the second pixel electrodes PE2 of the first pixel structures 120N of the third pixel series C3 and the second pixel group R2 have the second polarity (e.g., the positive polarity), the first data lines DL1 and the first pixel electrodes PE1 of the second pixel structures 120P of the fourth pixel series C4 and the second pixel group R2 have the second polarity (e.g., the positive polarity), the second data lines DL2 and the second pixel electrodes PE2 of the second pixel structures 120P of the fourth pixel series C4 and the second pixel group R2 have the first polarity (e.g., the negative polarity), the first data lines DL1 and the first pixel electrodes PE1 of the first pixel structures 120N of the fifth pixel series C5 and the second pixel group R2 have the first polarity (e.g., the negative polarity), the second data lines DL2 and the second pixel electrodes PE2 of the first pixel structures 120N of the fifth pixel series C5 and the second pixel group R2 have the second polarity (e.g., the positive polarity), the first data lines DL1 and the first pixel electrodes PE1 of the second pixel structures 120P of the sixth pixel series C6 and the second pixel group R2 have the second polarity (e.g., the positive polarity), and the second data lines DL2 and the second pixel electrodes PE2 of the second pixel structures 120P of the sixth pixel series C6 and the second pixel group R2 have the first polarity (e.g., the negative polarity).

Next, at a third timing following the second timing, the first active devices T1 and the second active devices T2 of the first pixel structures 120N and the second pixel structures 120P of the third pixel group R3 are switched on (i.e., the scan lines SL of the third pixel group R3 have the potential at which the gates are on), the first data lines DL1 and the first pixel electrodes PE1 of the first pixel structures 120N of the first pixel series C1 and the third pixel group R3 have the second polarity (e.g., the positive polarity), the second data lines DL2 and the second pixel electrodes PE2 of the first pixel structures 120N of the first pixel series C1 and the third pixel group R3 have the first polarity (e.g., the negative polarity), the first data lines DL1 and the first pixel electrodes PE1 of the second pixel structures 120P of the second pixel series C2 and the third pixel group R3 have the first polarity (e.g., the negative polarity), the second data lines DL2 and the second pixel electrodes PE2 of the second pixel structures 120P of the second pixel series C2 and the third pixel group R3 have the second polarity (e.g., the positive polarity), the first data lines DL1 and the first pixel electrodes PE1 of the first pixel structures 120N of the third pixel series C3 and the third pixel group R3 have the second polarity (e.g., the positive polarity), the second data lines DL2 and the second pixel electrodes PE2 of the first pixel structures 120N of the third pixel series C3 and the third pixel group R3 have the first polarity (e.g., the negative polarity), the first data lines DL1 and the first pixel electrodes PE1 of the second pixel structures 120P of the fourth pixel series C4 and the third pixel group R3 have the first polarity (e.g., the negative polarity), the second data lines DL2 and the second pixel electrodes PE2 of the second pixel structures 120P of the fourth pixel series C4 and the third pixel group R3 have the second polarity (e.g., the positive polarity), the first data lines DL1 and the first pixel electrodes PE1 of the first pixel structures 120N of the fifth pixel series C5 and the third pixel group R3 have the second polarity (e.g., the positive polarity), the second data lines DL2 and the second pixel electrodes PE2 of the first pixel structures 120N of the fifth pixel series C5 and the third pixel group R3 have the first polarity (e.g., the negative polarity), the first data lines DL1 and the first pixel electrodes PE1 of the second pixel structures 120P of the sixth pixel series C6 and the third pixel group R3 have the first polarity (e.g., the negative polarity), and the second data lines DL2 and the second pixel electrodes PE2 of the second pixel structures 120P of the sixth pixel series C6 and the third pixel group R3 have the second polarity (e.g., the positive polarity).

Next, at a fourth timing following the third timing, the first active devices T1 and the second active devices T2 of the first pixel structures 120N and the second pixel structures 120P of the fourth pixel group R4 are switched on (i.e., the scan lines SL of the fourth pixel group R4 have the potential at which the gates are on), the first data lines DL1 and the first pixel electrodes PE1 of the second pixel structures 120P of the first pixel series C1 and the fourth pixel group R4 have the first polarity (e.g., the negative polarity), the second data lines DL2 and the second pixel electrodes PE2 of the second pixel structures 120P of the first pixel series C1 and the fourth pixel group R4 have the second polarity (e.g., the positive polarity), the first data lines DL1 and the first pixel electrodes PE1 of the first pixel structures 120N of the second pixel series C2 and the fourth pixel group R4 have the second polarity (e.g., the positive polarity), the second data lines DL2 and the second pixel electrodes PE2 of the first pixel structures 120N of the second pixel series C2 and the fourth pixel group R4 have the first polarity (e.g., the negative polarity), the first data lines DL1 and the first pixel electrodes PE1 of the second pixel structures 120P of the third pixel series C3 and the fourth pixel group R4 have the first polarity (e.g., the negative polarity), the second data lines DL2 and the second pixel electrodes PE2 of the second pixel structures 120P of the third pixel series C3 and the fourth pixel group R4 have the second polarity (e.g., the positive polarity), the first data lines DL1 and the first pixel electrodes PE1 of the first pixel structures 120N of the fourth pixel series C4 and the fourth pixel group R4 have the second polarity (e.g., the positive polarity), the second data lines DL2 and the second pixel electrodes PE2 of the first pixel structures 120N of the fourth pixel series C4 and the fourth pixel group R4 have the first polarity (e.g., the negative polarity), the first data lines DL1 and the first pixel electrodes PE1 of the second pixel structures 120P of the fifth pixel series C5 and the fourth pixel group R4 have the first polarity (e.g., the negative polarity), the second data lines DL2 and the second pixel electrodes PE2 of the second pixel structures 120P of the fifth pixel series C5 and the fourth pixel group R4 have the second polarity (e.g., the positive polarity), the first data lines DL1 and the first pixel electrodes PE1 of the first pixel structures 120N of the sixth pixel series C6 and the fourth pixel group R4 have the second polarity (e.g., the positive polarity), and the second data lines DL2 and the second pixel electrodes PE2 of the first pixel structures 120N of the sixth pixel series C6 and the fourth pixel group R4 have the first polarity (e.g., the negative polarity).

At a fifth timing following the fourth timing, the first active devices T1 and the second active devices T2 of the first pixel structures 120N and the second pixel structures 120P of the fifth pixel group R5 are switched on (i.e., the scan lines SL of the fifth pixel group R5 have the potential at which the gates are on), the first data lines DL1 and the first pixel electrodes PE1 of the second pixel structures 120P of the first pixel series C1 and the fifth pixel group R5 have the second polarity (e.g., the positive polarity), the second data lines DL2 and the second pixel electrodes PE2 of the second pixel structures 120P of the first pixel series C1 and the fifth pixel group R5 have the first polarity (e.g., the negative polarity), the first data lines DL1 and the first pixel electrodes PE1 of the first pixel structures 120N of the second pixel series C2 and the fifth pixel group R5 have the first polarity (e.g., the negative polarity), the second data lines DL2 and the second pixel electrodes PE2 of the first pixel structures 120N of the second pixel series C2 and the fifth pixel group R5 have the second polarity (e.g., the positive polarity), the first data lines DL1 and the first pixel electrodes PE1 of the second pixel structures 120P of the third pixel series C3 and the fifth pixel group R5 have the second polarity (e.g., the positive polarity), the second data lines DL2 and the second pixel electrodes PE2 of the second pixel structures 120P of the third pixel series C3 and the fifth pixel group R5 have the first polarity (e.g., the negative polarity), the first data lines DL1 and the first pixel electrodes PE1 of the first pixel structures 120N of the fourth pixel series C4 and the fifth pixel group R5 have the first polarity (e.g., the negative polarity), the second data lines DL2 and the second pixel electrodes PE2 of the first pixel structures 120N of the fourth pixel series C4 and the fifth pixel group R5 have the second polarity (e.g., the positive polarity), the first data lines DL1 and the first pixel electrodes PE1 of the second pixel structures 120P of the fifth pixel series C5 and the fifth pixel group R5 have the second polarity (e.g., the positive polarity), the second data lines DL2 and the second pixel electrodes PE2 of the second pixel structures 120P of the fifth pixel series C5 and the fifth pixel group R5 have the first polarity (e.g., the negative polarity), the first data lines DL1 and the first pixel electrodes PE1 of the first pixel structures 120N of the sixth pixel series C6 and the fifth pixel group R5 have the first polarity (e.g., the negative polarity), and the second data lines DL2 and the second pixel electrodes PE2 of the first pixel structures 120N of the sixth pixel series C6 and the fifth pixel group R5 have the second polarity (e.g., the positive polarity). The first timing to the fifth timing are in the same frame time.

Figure 6:
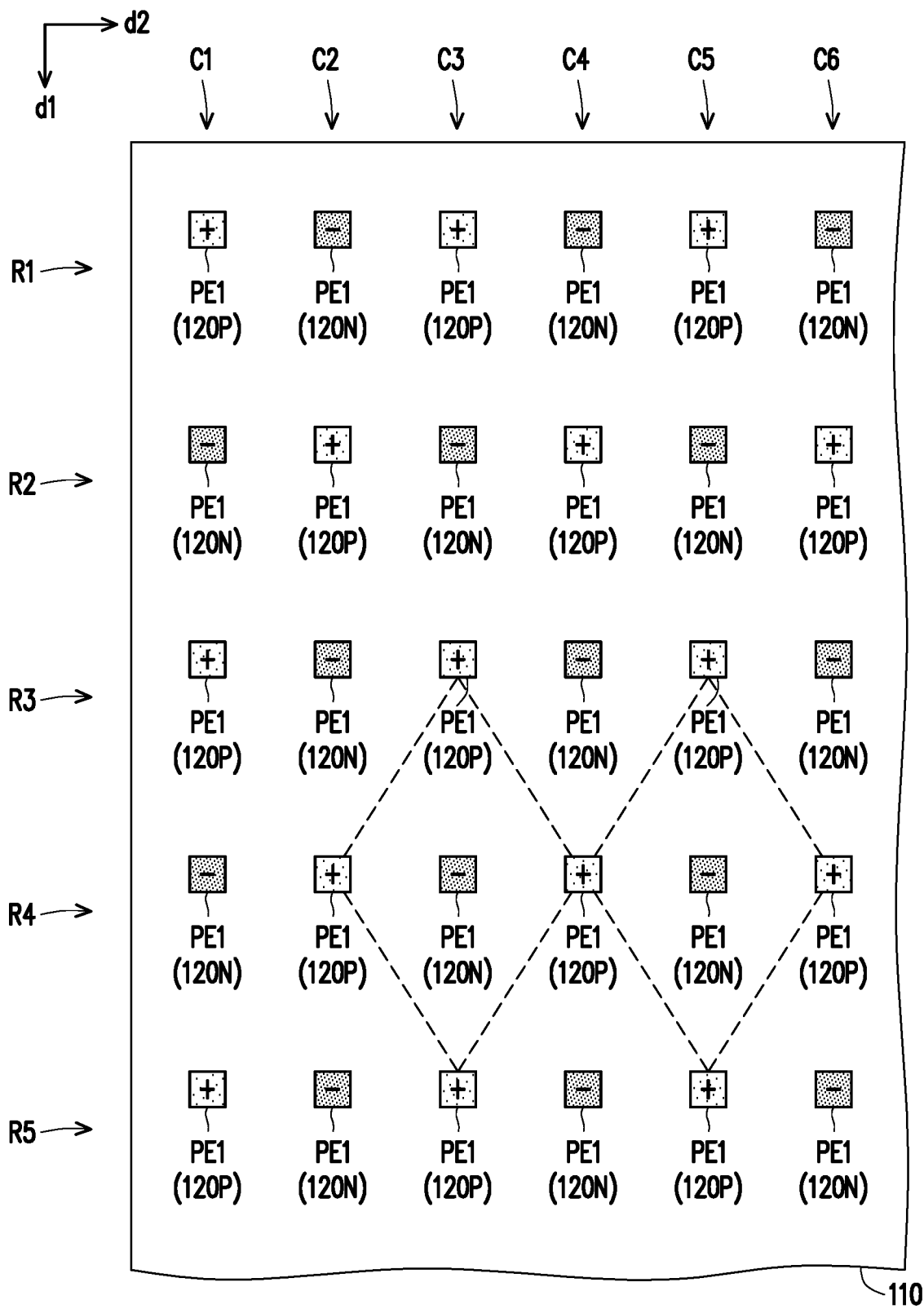
FIG. 6 illustrates a display image of a display panel using the pixel array substrate depicted in FIG. 1.

FIG. 6 illustrates a display image of a display panel using the pixel array substrate 10 depicted in FIG. 1, wherein dots arranged with high density represent dark regions, while dots arranged with low density represent bright regions. With reference to FIG. 1 and FIG. 6, for instance, when an image at a low grayscale level is being displayed, the difference between the potential of the first pixel electrodes PE1 of the main sub-pixel structures and a reference potential is sufficient to drive the overlying display medium (including but not limited to: liquid crystal), and the region where the first pixel electrodes PE1 of the main sub-pixel structures are located is lighted up; the difference between the potential of the second pixel electrodes PE2 of the secondary sub-pixel structures is insufficient to drive the overlying display medium, and the region where the second pixel electrodes PE2 of the secondary sub-pixel structures is located is substantially not lighted up.

While the image at the low grayscale level is being displayed, the first pixel electrodes PE1 of the main sub-pixel structures of the pixel array substrate 10 have the first polarity (e.g., the negative polarity) and the second polarity (e.g., the positive polarity), as shown in FIG. 6. At the time of displaying the image at the low grayscale level, since the reference potential of the display panel is not an ideal reference potential, the difference between the potential of the first pixel electrodes PE1 having the first polarity and the reference potential is different from the difference between the potential of the first pixel electrodes PE1 having the second polarity and the reference potential. Accordingly, the brightness of the regions where the first pixel electrodes PE1 having the first polarity are located is different from the brightness of the regions where the first pixel electrodes PE1 having the second polarity are located. For instance, in the present embodiment, the brightness of the regions where the first pixel electrodes PE1 having the second polarity are located is high, and the brightness of the regions where the first pixel electrodes PE1 having the first polarity are located is low, as shown in FIG. 6.

In view of the above-mentioned layout of the pixel array substrate 10 and the driving method thereof, a quasi-tetragon (e.g., a quasi-rhombus) (shown in dotted lines) formed by connecting the first pixel electrodes PE1 having the second polarity and substantially the same brightness has the shortest side length (or area). Hence, the quasi-tetragon formed by connecting the first pixel electrodes PE1 having the second polarity and substantially the same brightness is not apt to be perceived by human eyes, thus resolving the swing line issue.

It will be apparent to those skilled in the art that various modifications and variations can be made to the structure provided in the disclosure without departing from the scope or spirit indicated herein. In view of the foregoing, it is intended that the disclosure cover modifications and variations provided they fall within the scope of the following claims and their equivalents.

What is claimed is:

1. A pixel array substrate comprising:
   a plurality of pixel structures, each of the plurality of pixel structures comprising:
      a first active device and a second active device;
      a first pixel electrode and a second pixel electrode sequentially arranged in a first direction and electrically connected to the first active device and the second active device, respectively, wherein the first pixel electrode and the second pixel electrode have a first side and a second side opposite to each other;
      a first data line electrically connected to the first active device;
      a second data line electrically connected to the second active device; and
      a scan line electrically connected to the first active device and the second active device;
   the plurality of pixel structures comprising a plurality of first pixel structures and a plurality of second pixel structures;
   a first data line of each of the plurality of first pixel structures being located on the first side, a second data line of each of the plurality of first pixel structures being located on the second side;
   a first data line of each of the plurality of second pixel structures being located on the second side, a second data line of each of the plurality of second pixel structures being located on the first side;

the plurality of first pixel structures and the plurality of second pixel structures being sequentially arranged in the first direction to form a first pixel series;

in the first pixel series, the second data lines of the second pixel structures and the first data lines of the first pixel structures are electrically connected to form the same conductive wire, which is referred to as a first conductive wire;

in the first pixel series, the first data lines of the second pixel structures and the second data lines of the first pixel structures are electrically connected to form the same conductive wire, which is referred to as a second conductive wire.

2. The pixel array substrate according to claim 1, wherein the plurality of second pixel structures and the plurality of first pixel structures are sequentially arranged in the first direction to form a second pixel series, the first pixel series and the second pixel series are sequentially arranged in a second direction, and the first direction and the second direction are staggered.

3. The pixel array substrate according to claim 2, wherein one of the plurality of first pixel structures of the first pixel series and one of the second pixel structures of the second pixel series are sequentially arranged in the second direction to form a first pixel group, and a scan line of the one of the plurality of first pixel structures of the first pixel group and a scan line of the one of the plurality of second pixel structures of the first pixel group are electrically connected.

4. The pixel array substrate according to claim 3, wherein another of the plurality of first pixel structures of the first pixel series and another of the second pixel structures of the second pixel series are sequentially arranged in the second direction to form a second pixel group, and a scan line of the another of the plurality of first pixel structures of the second pixel group and a scan line of the another of the plurality of second pixel structures of the second pixel group are electrically connected.

5. The pixel array substrate according to claim 4, wherein one of the plurality of second pixel structures of the first pixel series and one of the first pixel structures of the second pixel series are sequentially arranged in the second direction to form a third pixel group, and a scan line of the one of the plurality of second pixel structures of the third pixel group and a scan line of the one of the plurality of first pixel structures of the third pixel group are electrically connected.

6. The pixel array substrate according to claim 5, wherein another of the plurality of second pixel structures of the first pixel series and another of the first pixel structures of the second pixel series are sequentially arranged in the second direction to form a fourth pixel group, and a scan line of the another of the plurality of second pixel structures of the fourth pixel group and a scan line of the another of the plurality of first pixel structures of the fourth pixel group are electrically connected.

7. The pixel array substrate according to claim 2, wherein the plurality of first pixel structures and the plurality of second pixel structures are sequentially arranged in the first direction to form a third pixel series, and the first pixel series, the second pixel series, and the third pixel series are sequentially arranged in the second direction.

8. The pixel array substrate according to claim 1, wherein the first data lines of the plurality of first pixel structures of the first pixel series and the second data lines of the plurality of second pixel structures of the first pixel series are electrically connected, and the second data lines of the plurality of first pixel structure of the first pixel series and the first data lines of the plurality of second pixel structures of the first pixel series are electrically connected.

9. A driving method for driving a pixel array substrate, wherein the pixel array substrate comprises a plurality of pixel structures, each of the plurality of pixel structures comprises a first active device, a second active device, a first pixel electrode, a second pixel electrode, a first data line electrically connected to the first active device, a second data line electrically connected to the second active device and a scan line electrically connected to the first active device and the second active device, the first pixel electrode and the second pixel electrode sequentially arranged in a first direction and electrically connected to the first active device and the second active device, respectively, the first pixel electrode and the second pixel electrode have a first side and a second side opposite to each other, the plurality of pixel structures comprises a plurality of first pixel structures and a plurality of second pixel structures, a first data line of each of the plurality of first pixel structures is located on the first side, a second data line of each of the plurality of first pixel structures is located on the second side, a first data line of each of the plurality of second pixel structures is located on the second side, a second data line of each of the plurality of second pixel structures is located on the first side, the plurality of first pixel structures and the plurality of second pixel structures are sequentially arranged in the first direction to form a first pixel series, wherein in the first pixel series, the second data lines of the second pixel structures and the first data lines of the first pixel structures are electrically connected to form the same conductive wire, which is referred to as a first conductive wire; in the first pixel series, the first data lines of the second pixel structures and the second data lines of the first pixel structures are electrically connected to form the same conductive wire, which is referred to as a second conductive wire, the plurality of second pixel structures and the plurality of first pixel structures are sequentially arranged in the first direction to form a second pixel series, the first pixel series and the second pixel series are sequentially arranged in a second direction, and the first direction and the second direction are staggered; the driving method comprising:

at a first timing, switching on the first active device and the second active device of one of the plurality of first pixel structures of the first pixel series, the first data line of the one of the plurality of first pixel structures of the first pixel series having a first polarity, the second data line of the one of the plurality of first pixel structures of the first pixel series having a second polarity opposite to the first polarity;

at the first timing, switching on the first active device and the second active device of one of the plurality of second pixel structures of the second pixel series, the first data line of the one of the plurality of second pixel structures of the second pixel series having the second polarity, the second data line of the one of the plurality of second pixel structures of the second pixel series having the first polarity;

at a second timing, switching on the first active device and the second active device of another of the plurality of first pixel structures of the first pixel series, the first data line of the another of the plurality of first pixel structures of the first pixel series having the second polarity, the second data line of the another of the plurality of first pixel structures of the first pixel series having the first polarity; and at the second timing, switching on the first active device and the second active device of another of the plurality of second pixel structures of the second pixel series, the first data line of the another of the plurality of second pixel structures of the second pixel series having the first polarity, the second data line of the another of the plurality of second pixel structures of the second pixel series having the second polarity, wherein the first timing and the second timing sequentially occur.

10. The driving method according to claim 9, further comprising:
   at a third timing, switching on the first active device and the second active device of one of the plurality of second pixel structures of the first pixel series, the first data line of the one of the plurality of second pixel structures of the first pixel series having the first polarity, the second data line of the one of the plurality of second pixel structures of the first pixel series having the second polarity;
   at the third timing, switching on the first active device and the second active device of one of the plurality of first pixel structures of the second pixel series, the first data line of the one of the plurality of first pixel structures of the second pixel series having the second polarity, the second data line of the one of the plurality of first pixel structures of the second pixel series having the first polarity;
   at a fourth timing, switching on the first active device and the second active device of another of the plurality of second pixel structures of the first pixel series, the first data line of the another of the plurality of second pixel structures of the first pixel series having the second polarity, the second data line of the another of the plurality of second pixel structures of the first pixel series having the first polarity; and
   at the fourth timing, switching on the first active device and the second active device of another of the plurality of first pixel structures of the second pixel series, the first data line of the another of the plurality of first pixel structures of the second pixel series having the first polarity, the second data line of the another of the plurality of first pixel structures of the second pixel series having the second polarity,
   wherein the first timing, the second timing, the third timing, and the fourth timing sequentially occur.

* * * * *